(12) United States Patent
Hayashi et al.

(10) Patent No.: US 11,480,872 B2
(45) Date of Patent: Oct. 25, 2022

(54) IMPRINT APPARATUS, IMPRINT METHOD, AND METHOD FOR MANUFACTURING ARTICLE

(71) Applicant: CANON KABUSHIKI KAISHA, Tokyo (JP)

(72) Inventors: Tatsuya Hayashi, Tochigi (JP); Ken-Ichiro Shinoda, Tochigi (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 17/083,150

(22) Filed: Oct. 28, 2020

(65) Prior Publication Data

US 2021/0132492 A1 May 6, 2021

(30) Foreign Application Priority Data

Oct. 30, 2019 (JP) .............................. JP2019-197773

(51) Int. Cl.
*G03F 7/00* (2006.01)
*B29C 33/42* (2006.01)

(52) U.S. Cl.
CPC .......... *G03F 7/0002* (2013.01); *B29C 33/424* (2013.01); *B29C 2033/426* (2013.01)

(58) Field of Classification Search
CPC .............................................. B29C 2033/426
See application file for complete search history.

(56) References Cited

U.S. PATENT DOCUMENTS

| 2009/0257044 | A1* | 10/2009 | Sewell | G03F 7/70208 355/71 |
| 2017/0146903 | A1* | 5/2017 | Hayashi | B82Y 10/00 |
| 2018/0149969 | A1* | 5/2018 | Sato | G03F 7/0002 |
| 2019/0179228 | A1* | 6/2019 | Khusnatdinov | G03F 7/70116 |
| 2019/0221421 | A1* | 7/2019 | Fukuhara | G03F 7/0002 |

FOREIGN PATENT DOCUMENTS

| JP | 2011-521438 A | 7/2011 |
| WO | 2009/099666 A1 | 8/2009 |

* cited by examiner

*Primary Examiner* — Kelly M Gambetta
*Assistant Examiner* — Virak Nguon
(74) *Attorney, Agent, or Firm* — Canon U.S.A., Inc. IP Division

(57) ABSTRACT

An imprint apparatus includes first illumination optical system for emit light to cure imprint material between mold and substrate, second illumination optical system having light adjuster for illuminating the imprint material in part of region between the mold and the substrate, combiner located on pupil plane common to the first and second illumination optical systems and configured to combine the light from the first illumination optical system and the light from the second illumination optical system The combiner combines the light from the first illumination optical system and the light from the second illumination optical system by a mirror located in region surrounded by illumination region of the first illumination optical system including annular light intensity distribution on the pupil plane reflecting the light from the second illumination optical system.

9 Claims, 8 Drawing Sheets

IMPRINT APPARATUS, IMPRINT METHOD, AND METHOD FOR MANUFACTURING ARTICLE

BACKGROUND

Field of the Disclosure

The present disclosure relates to an imprint apparatus, an imprint method, and a method for manufacturing an article.

Description of the Related Art

As a method for manufacturing an article such as a semiconductor device or microelectromechanical systems (MEMS), an imprint method for molding an imprint material on a substrate using a mold is known. In the imprint method, the imprint material is supplied onto the substrate, and the supplied imprint material and the mold are brought into contact with each other (pressing). Further, after the imprint material is cured (by being irradiated with light for curing the imprint material) in a state in which the imprint material and the mold are in contact with each other, the mold is separated (released) from the cured imprint material, thereby forming a pattern of the imprint material on the substrate. The imprint method can form a minute structure in several to several tens of nanometer scale on the substrate.

An imprint apparatus can include a curing light illumination system that emits light (ultraviolet light) for curing an imprint material, and an alignment optical system that detects alignment marks to perform a position adjustment of a mold and a substrate. Further, Japanese Patent Laid-Open No. 2011-521438 discusses that, to prevent a phenomenon that an imprint material sandwiched between a mold and a substrate seeps out to the outside of a region where a pattern of the mold is formed, an imprint apparatus emits light to a partial region of the region where the pattern is formed. Further, there is a method for, to reduce a relative vibration between a mold and a substrate after the mold and an imprint material come into contact with each other, emitting light to a partial region of a region where the pattern is formed, thereby improving the viscous property of the imprint material and improving accuracy of the position adjustment of the mold and the substrate.

As described above, before curing the imprint material in the region where the pattern of a mold is formed, the imprint apparatus may emit light to the partial region of the region where the pattern of the mold is formed. In such advance emission of light, the light is emitted to the imprint material and the substrate through the mold. Thus, an illumination system of the imprint apparatus can be configured to combine optical paths of light emitted from light sources different from each other before the light is emitted to the mold.

Light for preventing the imprint material from seeping out can be emitted to a partial region of a shot region of the substrate (i.e., pattern region of the mold) (e.g., a region including outer edges of the shot region). Thus, an irradiation region of the light for preventing the imprint material from seeping out and an irradiation region of light for curing the imprint material can be different from each other. The wavelength of the light for preventing the imprint material from seeping out needs to be a wavelength to which a photosensitive material included in the imprint material has sensitivity, and thus is close to the wavelength of the light for curing the imprint material (curing light). Since the wavelength of the light for preventing the imprint material from seeping out and the wavelength of the light for curing the imprint material are close to each other, it is difficult to combine the optical paths using a dichroic mirror.

SUMMARY

The present disclosure is directed to providing an imprint apparatus including an illumination system for light for curing an imprint material, and an illumination system for light for illuminating the imprint material in a part of a region sandwiched between a mold and a substrate.

One of aspects of the present invention provides an imprint apparatus that cures an uncured imprint material supplied onto a substrate in a state in which the uncured imprint material and a mold are in contact with each other, and then separates the mold from the imprint material to form a pattern of the imprint material, the imprint apparatus comprising: a first illumination optical system configured to emit light for curing the imprint material sandwiched between the mold and the substrate; a second illumination optical system including a light adjuster configured to illuminate the imprint material in a part of a region sandwiched between the mold and the substrate, the second illumination optical system configured to emit light for increasing a viscosity of the imprint material in the part of the region or light for curing the imprint material in the part of the region; and a combiner located on a pupil plane common to the first illumination optical system and the second illumination optical system and configured to combine the light from the first illumination optical system and the light from the second illumination optical system, wherein the combiner combines the light from the first illumination optical system and the light from the second illumination optical system by a mirror located in a region surrounded by an illumination region of the first illumination optical system including an annular light intensity distribution on the pupil plane reflecting the light from the second illumination optical system.

Further features of the present invention will become apparent from the following description of exemplary embodiments with reference to the attached drawings.

DESCRIPTION OF THE EMBODIMENTS

Figure 1:
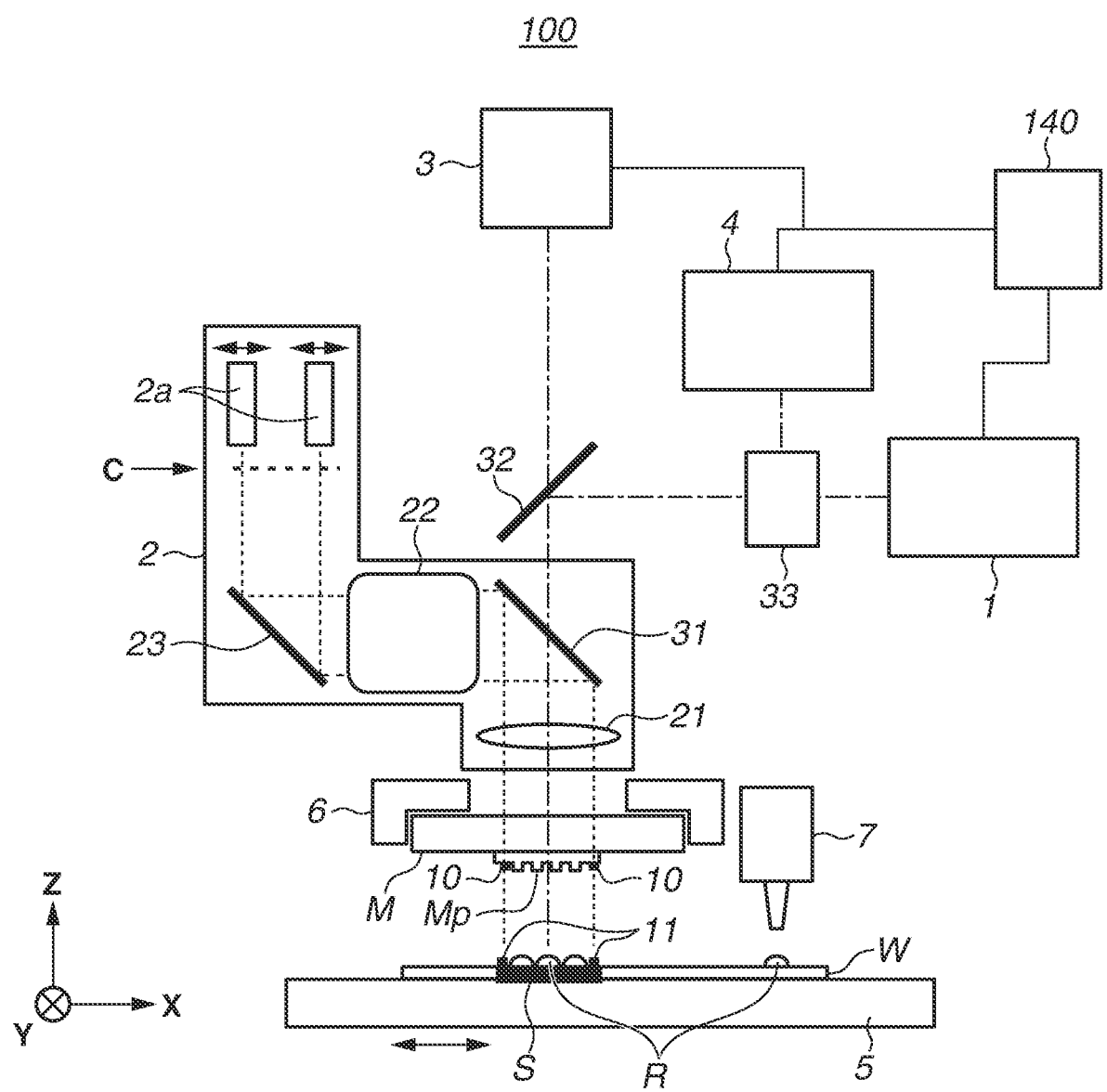
FIG. 1 is a diagram illustrating a configuration of an imprint apparatus according to a first exemplary embodiment.

Desirable exemplary embodiments of the present invention will be described in detail below based on the attached drawings. In the drawings, similar members are designated by the same reference numbers and are not redundantly described.

A configuration of an imprint apparatus 100 according to a first exemplary embodiment is described. FIG. 1 is a diagram illustrating the configuration of the imprint apparatus 100 according to the first exemplary embodiment. Axes are determined as illustrated in FIG. 1 so that a plane on which a substrate W is placed is an XY-plane, and a direction orthogonal to the XY-plane is a Z-direction. The imprint apparatus 100 is an apparatus that is used to manufacture a device such as a semiconductor device. The apparatus molds or shapes an imprint material on the substrate W (wafer) as a processed object using a mold M, thereby forming a pattern of the imprint material on the substrate W. The imprint apparatus 100 brings the imprint material supplied onto the substrate W and the mold M into contact with each other and gives curing energy to the imprint material, thereby forming the pattern of the cured product to which an uneven pattern of the mold M is transferred. The imprint apparatus 100 in FIG. 1 can be used to manufacture a device such as a semiconductor device as an article. In this case, the imprint apparatus 100 employing a photo-curing method is described.

The imprint apparatus 100 can include an exposure illumination system 1, an alignment optical system 2, an observation optical system 3, a preliminary exposure optical system 4, a wafer stage 5, a mold holder 6, and an applier 7.

The mold M is a member for molding or shaping the imprint material on the substrate W. The mold M can also be referred to as a template or an original. The mold M has a rectangular outer shape and includes a region (pattern region of the mold M) where a predetermined pattern (e.g., an uneven pattern Mp such as a circuit pattern) that is to be transferred to (the imprint material on) the substrate W is formed. The mold M is composed of a material that transmits light (ultraviolet light) for curing the imprint material on the substrate W, such as quartz. In the pattern region of the mold M, mold-side alignment marks 10 used for position adjustment with the substrate W are formed.

The wafer stage 5 is a substrate holder that holds the substrate W by attracting the substrate W with a vacuum suction force or an electrostatic force and enables the substrate W to move in the XY-plane. The substrate W is a processing target object composed of, for example, single crystal silicon. Onto a processing target surface of the substrate W, an imprint material R (ultraviolet-curable resin) to be molded by the mold M is supplied. As the substrate W, glass, a ceramic, a metal, a semiconductor, or a resin is used. On the surface of the substrate W, a member composed of a different material from the substrate W may be formed, where necessary. More specifically, examples of the substrate W include a silicon wafer, a compound semiconductor wafer, and quartz glass.

The mold holder 6 is a mold holder that holds the mold M by attracting the mold M with the vacuum suction force or the electrostatic force. The mold holder 6 can include a mold chuck (not illustrated), and a mold driving mechanism (not illustrated) for driving the mold chuck in the Z-axis direction to bring the mold M and the imprint material R supplied onto the substrate W in contact with each other. Further, the mold holder 6 may include a shape correction mechanism for deforming the mold M by applying a force to the mold M in the X-axis direction and the Y-axis direction, thereby correcting distortion of the pattern of the imprint material R formed on the substrate W.

In the imprint apparatus 100, an operation of bringing the imprint material R on the substrate W and the mold M into contact with each other and an operation of separating the mold M from the imprint material R are not limited to movement of the mold M in the Z-direction by moving the mold holder 6. The operation of bringing the imprint material R and the mold M into contact with each other and the operation of separating the mold M from the imprint material R may be carried out by moving the substrate W in the Z-direction by moving the wafer stage 5, or may be carried out by moving both the mold holder 6 and the wafer stage 5.

To cure the imprint material R after a pressing process (contact process) in which the mold M and the imprint material R on the substrate W are brought into contact with each other, the exposure illumination system 1 (first illumination optical system) emits light (ultraviolet light) for curing the imprint material R to the region where the uneven pattern Mp of the mold M is formed. The exposure illumination system 1 can include a light source, and a plurality of optical elements for uniformly emitting, in a predetermined shape, light emitted from the light source to the uneven pattern Mp of the mold M as an irradiation target surface. An irradiation region (illumination range) of the light from the exposure illumination system 1 can be comparable to the region where the uneven pattern Mp is formed. However, in relation to an irradiation region (illumination range) of the preliminary exposure optical system 4 described below, the irradiation region of the exposure illumination system 1 may be slightly inside the region where the uneven pattern Mp is formed.

As the light source of the exposure illumination system 1, for example, a high pressure mercury lamp, various excimer lamps, an excimer laser, a light-emitting diode, or a laser diode can be employed. The light source is appropriately selected to suit the characteristics of the imprint material R to be supplied onto the substrate W. However, the present exemplary embodiment is not limited by the type, the number, or the wavelength of the light source.

The alignment optical system 2 performs a measurement for relative position adjustment of the mold M and the substrate W. The alignment optical system 2 can be used to optically detect the relative positions of the mold-side alignment marks 10 formed on the mold M and substrate-side alignment marks 11 formed on the substrate W (relative positions of the mold M and the substrate W). The imprint apparatus 100 can obtain the relative positions of the mold M and the substrate W using the detection result of the alignment optical system 2 and move at least one of the wafer stage 5 and the mold holder 6, thereby aligning the mold M and the substrate W. Based on the result of the measurement of the relative positions of the mold M and the substrate W performed by the alignment optical system 2, the imprint apparatus 100 may drive the shape correction mechanism included in the mold holder 6, thereby deforming the pattern region formed on the mold M.

The alignment optical system 2 can include a plurality of light-receiving units 2a that can form respective scopes that can be driven. The plurality of light-receiving units 2a is configured to be driven in the X-axis direction and the Y-axis direction to be aligned with the alignment marks 10 on the mold M or the alignment marks 11 on the substrate W. The alignment optical system 2 can be configured to be driven also in the Z-axis direction to bring the scopes into focus at the positions of the marks 10 or 11. In the alignment optical system 2, optical members 21, 31, 22, and 23 can constitute a relay optical system. The relay optical system can be configured to form a plane conjugate to the surface of the substrate W at a position C. Images of the alignment marks 10 or 11 can be formed on the conjugate plane formed at the position C by the relay optical system, and the alignment marks 10 or 11 of which the images are formed can be detected by the light-receiving units 2a.

On the substrate W, a multilayer film can be formed of a wide variety of substances. The alignment marks 11 on the substrate W are generally formed on any layer of the multilayer film. If the wavelength range of light used in the alignment optical system 2 is narrow and waves of light from the alignment optical system 2 have wavelengths in an interference condition in which the waves of light weaken each other, signals from the alignment marks 11 on the substrate W are weak, and it is difficult to perform the position adjustment.

Thus, it is desirable that the wavelength of light used in the alignment optical system 2 be wavelength at which the imprint material R does not cure and which covers as wide a range as possible. It is desirable that the wavelength of light used in the alignment optical system 2 cover the wavelength range of 400 to 2000 nm, for example. It is desirable that the wavelength of light used by the alignment optical system 2 cover at least 500 to 800 nm. As the light source of the alignment optical system 2, for example, a lamp with a wide light emission wavelength range may be employed. Alternatively, a plurality of light sources (light-emitting diodes or laser diodes) with wavelength ranges of several tens of nanometers and several nanometers may be combined together, whereby the wavelength of light used in the alignment optical system 2 may discretely cover a wide range.

The observation optical system 3 is a scope that enables observation of an entire shot region S of the substrate W. The observation optical system 3 can be used to check a state of an imprint process, such as a state in which the mold M is pressed against the imprint material R (state in which the mold M is in contact with the imprint material R), a state in which the imprint material R fills a space between the substrate W and the mold M (or the uneven pattern Mp of the mold M), or a state in which the mold M and the substrate W are released from each other. A measurement target of the observation optical system 3 can be the pattern region where the uneven pattern Mp of the mold M is formed or the surface of the substrate W, or can be the pattern region and the surface of the substrate W in a case where the pattern region and the surface of the substrate W are near each other.

The substance composing the mold M and the substance composing the surface (top layer) of the substrate W are substances excellent in pressing properties and filling properties in the imprint process. As these substances, particular substances tend to be used. Thus, light from the observation optical system 3 does not require as wide a range as the light from the alignment optical system 2, and may have a wavelength at which the imprint material R does not cure. The mold M or the substrate W may expand due to heat associated with the light (observation light) emitted from the observation optical system 3, and a positional shift or distortion may occur in the pattern of the imprint material R formed in the shot region S of the substrate W. Thus, it is desirable that the light emitted from the observation optical system 3 have a range where the state of the imprint process can be observed and be weak.

The preliminary exposure optical system 4 (second illumination optical system) illuminates a partial region of the shot region S of the substrate W carried into the imprint apparatus 100 to increase the viscous property (viscosity) of the imprint material R on the partial region of the shot region S or cure the imprint material R on the partial region of the shot region S. For example, before bringing the mold M and the imprint material R supplied onto the substrate W in contact with each other and irradiating the imprint material R with the light from the exposure illumination system 1 to cure the imprint material R, the preliminary exposure optical system 4 may emit light to only a partial region of the shot region S including an outer periphery of the shot region S. Consequently, it is possible to reduce seeping out of the imprint material R to the outside of the shot region S (pattern region) after the pattern region of the mold M and the imprint material R come into contact with each other.

The preliminary exposure optical system 4 can irradiate a partial region of the shot region S in a state in which the pattern region of the mold M and the imprint material R are in contact with each other. Consequently, it is possible to increase the viscous property (viscosity) of the imprint material R and reduce relative vibration between the mold M and the substrate W. As described above, the preliminary exposure optical system 4 can increase the viscous property (viscosity) of the imprint material R on a pinpoint region in the shot region S. Thus, it is desirable that the light from the preliminary exposure optical system 4 have a wavelength at which the viscous property (viscosity) of the imprint material R is increased or a wavelength at which the imprint material R cures. The timing of emission of the light from the preliminary exposure optical system 4 can be controlled independently of the timing of emission of the light from the exposure illumination system 1.

The imprint apparatus 100 in FIG. 1, as described above, includes the optical members 21 and 31 as a part of the relay optical system of the alignment optical system 2. The optical member 21 functions as a common optical system that handles not only alignment light but also the light from the exposure illumination system 1, the light from the observation optical system 3, and the light from the preliminary exposure optical system 4.

The optical member 31 can reflect alignment light from the alignment optical system 2 and transmit exposure illumination light from the exposure illumination system 1, observation light from the observation optical system 3, and preliminary exposure light from the preliminary exposure optical system 4. The optical members 21 and 31 can be composed of members (e.g., quartz or fluorite) having sufficiently high transmittance for the exposure illumination light and the preliminary exposure light, which are ultraviolet light.

The optical member 31 is, for example, a dichroic mirror and can have the characteristics that the reflectance is high in the wavelength range of 500 to 2000 nm and the transmittance is high in the wavelength range of 200 to 500 nm. The wavelength range in which the reflectance is high is not limited to 500 to 2000 nm, and it is desirable that the wavelength range be wide. Due to manufacturing constraints, for example, the wavelength range may be 600 to 900 nm or 500 to 800 nm. Similarly, the wavelength range in which the transmittance is high is not limited to 200 to 500 nm, and it is desirable that the wavelength range be wide. The wavelength range may be 300 to 600 nm or 300 to 500 nm, for example.

An optical member 32 can reflect the exposure illumination light from the exposure illumination system 1 and transmit the observation light from the observation optical system 3. The optical member 32 is, for example, a dichroic mirror and can have the characteristics that the reflectance is high in the wavelength range of 400 nm or less (200 to 400 nm or 300 to 400 nm) and the transmittance is high in the wavelength range of 400 nm or more (400 to 500 nm or 400 to 600 nm). The threshold for the wavelength is not limited to 400 nm, and may be 380 nm or 420 nm, for example.

An optical combiner 33 can combine the light from the exposure illumination system 1 and the light from the preliminary exposure optical system 4. Since the wavelengths of the light from the exposure illumination system 1 and the light from the preliminary exposure optical system 4 are close to each other (or are the same or in an inclusive relation), a dichroic mirror may not be able to be used as the optical combiner 33. The optical combiner 33 will be described in detail below.

Since the preliminary exposure optical system 4 illuminates a partial region of the shot region S (e.g., a frame-like or spot-like region), it is desirable that the preliminary exposure optical system 4 include a light source with high output and high luminance. As the light source of the preliminary exposure optical system 4, for example, a laser diode is desirable. Alternatively, various lamps or a light-emitting diode can also be used depending on the required illuminance.

The applier 7 (dispenser) may be understood as a supplier that supplies the uncured imprint material R onto the substrate W. The imprint material R can be a photocurable resin having the property of curing by receiving ultraviolet light. The imprint material R can be appropriately selected based on the type of the semiconductor device. The applier 7 does not have to be installed within the imprint apparatus 100. In this case, an application device can be provided outside the imprint apparatus 100, and the substrate W onto which the imprint material R is applied in advance by the application device can be carried into the imprint apparatus 100.

As the imprint material R, a curable composition that cures by being given curing energy (also occasionally referred to as a resin in an uncured state) can be used. As the curing energy, an electromagnetic wave or heat is used. As the electromagnetic wave, for example, light of which the wavelength is selected from the range of 10 nm or more and 1 mm or less, such as infrared light, visible light, or ultraviolet light, is used.

The curable composition is a composition that cures by being irradiated with light or being heated. A light-curable composition that cures by being irradiated with light contains at least a polymerizable compound and a photopolymerization initiator, and may contain a non-polymerizable compound or a solvent, where necessary. The non-polymerizable compound is at least one type selected from a group of a sensitizer, a hydrogen donor, an internal mold release agent, a surfactant, an antioxidant, and a polymer component.

The imprint material R may be applied in the form of a film onto the substrate W by a spin coater or a slit coater. Alternatively, the imprint material R may be applied in the form of a droplet or in the form of an island or a film formed of a plurality of droplets that are connected, onto the substrate W by a liquid jet head. The viscosity (viscosity at 25° C.) of the imprint material R is, for example, 1 mPa·s or more and 100 mPa·s or less.

The imprint apparatus 100 can include a controller 140 that controls operations of components of the imprint apparatus 100. The controller 140 can control the operations and adjustments of the components of the imprint apparatus 100. The controller 140 can include, for example, a computer. The controller 140 can be connected to the components of the imprint apparatus 100 via a circuit and control the components based on a program. The controller 140 according to the present exemplary embodiment controls at least the operation of the preliminary exposure optical system 4. The controller 140 may be provided in the imprint apparatus 100 (in a common housing), or may be installed in a different location (in a different housing) from the imprint apparatus 100 and remotely control the components of the imprint apparatus 100.

Figure 2:
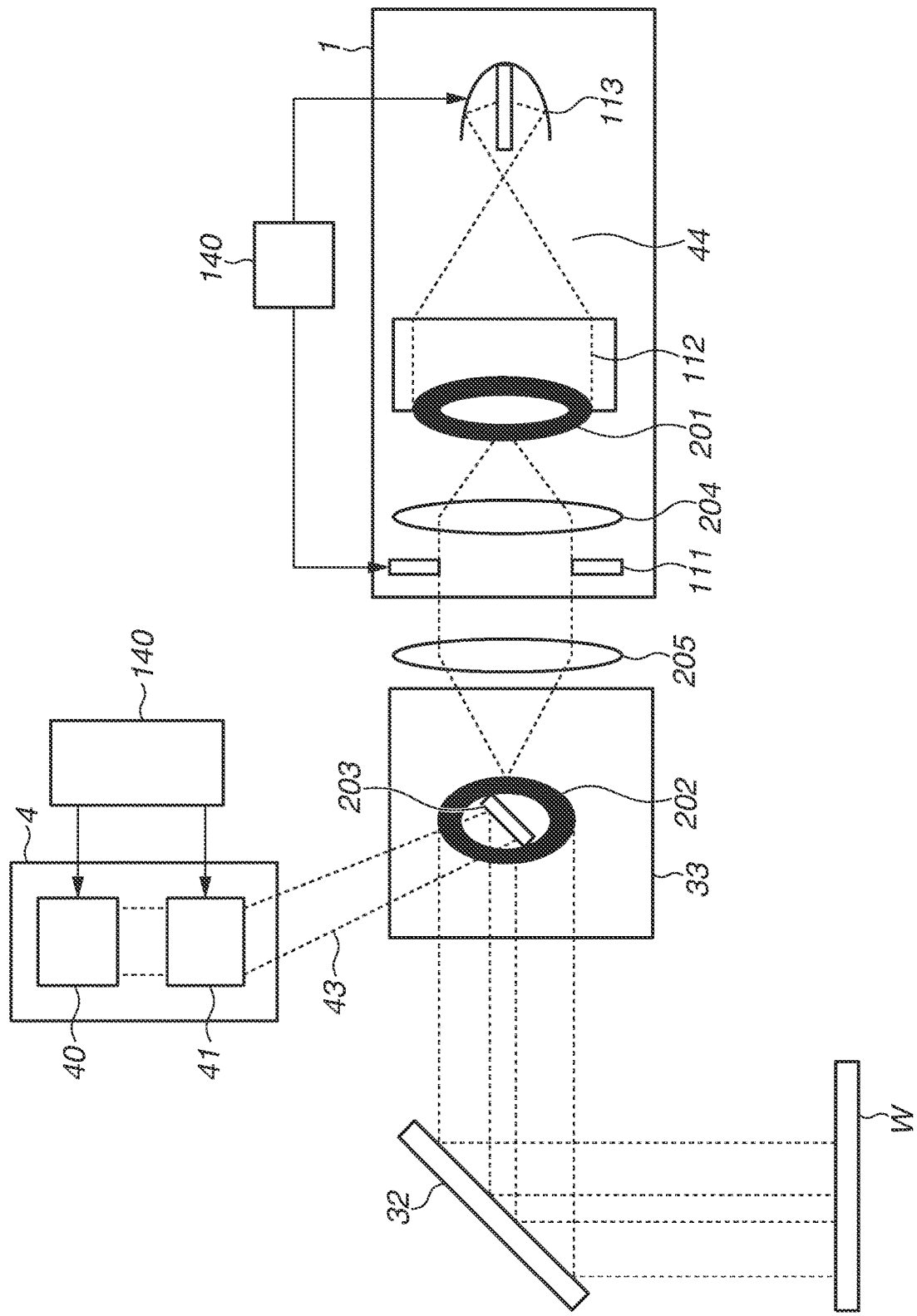
FIG. 2 is a diagram illustrating configurations of an optical system that cures an imprint material and an optical system that illuminates a partial region of a shot region in the imprint apparatus according to the first exemplary embodiment.

FIG. 2 is a schematic diagram illustrating the configurations and the placement of the exposure illumination system 1, the preliminary exposure optical system 4, and the optical combiner 33. With reference to FIG. 2, the optical combiner 33 is described in detail. In FIG. 2, components similar to those in FIG. 1 are designated by the same signs and are not described.

The preliminary exposure optical system 4 emits light to a partial region of the shot region S formed on the substrate W carried into the imprint apparatus 100 to increase the viscous property (viscosity) of the imprint material R on the partial region of the shot region S or cure the imprint material R. The preliminary exposure optical system 4 can include a light source 40 and a light adjuster 41 that adjusts the illumination shape (light intensity distribution) of preliminary exposure light 43 emitted to the shot region S of the substrate W to a desired shape.

The light source 40 can generate light for increasing the viscous property (viscosity) of the imprint material R or light of a wavelength at which the imprint material R cures. The light source 40 can generate light of a wavelength in the wavelength range of 300 to 450 nm, for example. Further, it is desirable that optical blur on the surface of the substrate W due to the light emitted from the light source 40 be small. Thus, it is desirable that the light source 40 be a light source that generates light of a short wavelength that facilitates design for reducing the optical blur caused by the optical system.

To obtain the irradiation region having a desired shape at least in a planar region (XY-plane) in the shot region S of the substrate W, the light adjuster 41 can convert the preliminary exposure light 43 into any light intensity distribution. The light emitted from the light source 40 irradiates the shot region S of the substrate W through the light adjuster 41. As the light adjuster 41, for example, a liquid crystal device can be employed in which a plurality of liquid crystal elements is arranged on a light transmission surface and which can change an irradiation amount distribution by individually controlling a voltage to be applied to each of the plurality of liquid crystal elements. Alternatively, as the light adjuster 41, a digital mirror device (digital micromirror device (DMD)) may be employed in which a plurality of mirror elements is arranged in an array on a light reflection surface, and the digital mirror device can change the irradiation amount distribution by individually adjusting the directions of surfaces of the mirror elements. Yet alternatively, as the light adjuster 41, a galvanometer mirror element or a diffractive element (hologram) such as a computer-generated hologram (CGH) may be employed.

As illustrated in FIG. 2, the exposure illumination system 1 includes a field stop 111. The field stop 111 limits an illumination region in the substrate W. The field stop 111 is located at a position optically conjugate to the surface of the substrate W. The size of the field stop 111 can be determined based on the size of the shot region S of the substrate W. An aperture portion of the field stop 111 may be, for example, a rectangular fixed aperture. However, it is desirable that the aperture portion of the field stop 111 have a configuration in which a plurality of (e.g., four) blades can be independently driven so that the shape of the aperture portion can be adjusted. To form a uniform illumination distribution in the field stop 111, an optical integrator 112 may be located between a light source 113 and the field stop 111. The light source 113 can include, for example, an ultraviolet lamp. Light from the ultraviolet lamp can be collected by an oval mirror included in the light source 113. The light is collected by the oval mirror, whereby light having an annular intensity distribution such as light intensity distributions 201 and 202 can be formed. As described above, light emitted from the light source 113 can form the annular light intensity distribution 201 on an exit surface of the optical integrator 112.

The optical combiner 33 for combining the optical path of the exposure illumination system 1 and the optical path of the preliminary exposure optical system 4 is located at a position where the optical combiner 33 has an optical Fourier transform relationship with the surface of the substrate W. More specifically, an angle distribution of light emitted from the optical combiner 33 is converted into a light intensity distribution on the surface of the substrate W. In another viewpoint, the exposure illumination system 1 and the preliminary exposure optical system 4 are configured so that image planes of the exposure illumination system 1 and the preliminary exposure optical system 4 coincide with the surface of the substrate W and the exposure illumination system 1 and the preliminary exposure optical system 4 have a common pupil plane. Then, the optical combiner 33 is located on the pupil plane. Thus, the light adjuster 41 of the preliminary exposure optical system 4 controls the angle distribution in the optical combiner 33, whereby a desired light intensity distribution (frame-like illumination or pinpoint illumination) can be formed on the surface of the substrate W.

An optical path between the preliminary exposure optical system 4 and the optical combiner 33 and an optical path between the exposure illumination system 1 and the optical combiner 33 can be spatially separated from each other. In FIG. 2, the light from the preliminary exposure optical system 4 is deflected by a mirror 203 located in a center portion of the optical combiner 33 and guided to the substrate W. Meanwhile, the light from the exposure illumination system 1 forms the annular light intensity distribution 201 on the exit surface of the optical integrator 112 and is incident on the optical combiner 33 through optical members 204 and 205. The optical members 204 and 205 constitute an image forming optical system, and the image forming optical system forms an image having the light intensity distribution 202 on the pupil plane from an image having the light intensity distribution 201. The annular light intensity distribution 201 in the optical integrator 112 and the annular light intensity distribution 202 in the mirror 203 are located at positions optically conjugate to each other. The mirror 203 that reflects the light from the preliminary exposure optical system 4 can be located inside the annular light intensity distribution 202. Such a configuration prevents the light from the exposure illumination system 1 and the light from the preliminary exposure optical system 4 from spatially interfering with each other. The mirror 203 is an optical element including a reflection surface located within a region that is inside the annular light intensity distribution 202 and to which light is not emitted. The mirror 203 can be composed of, for example, a transparent member and a reflective member provided only in a region of the transparent member that is to reflect the light from the preliminary exposure optical system 4. In this case, the light from the exposure illumination system 1 passes through a region surrounding the reflective member provided in the mirror 203, whereby the optical combiner 33 can combine the light from the exposure illumination system 1 and the light from the preliminary exposure optical system 4. Even if the light from the exposure illumination system 1 has an annular light intensity distribution on the pupil plane, the surface of the substrate W can be uniformly illuminated with a uniform light intensity.

Figure 3:
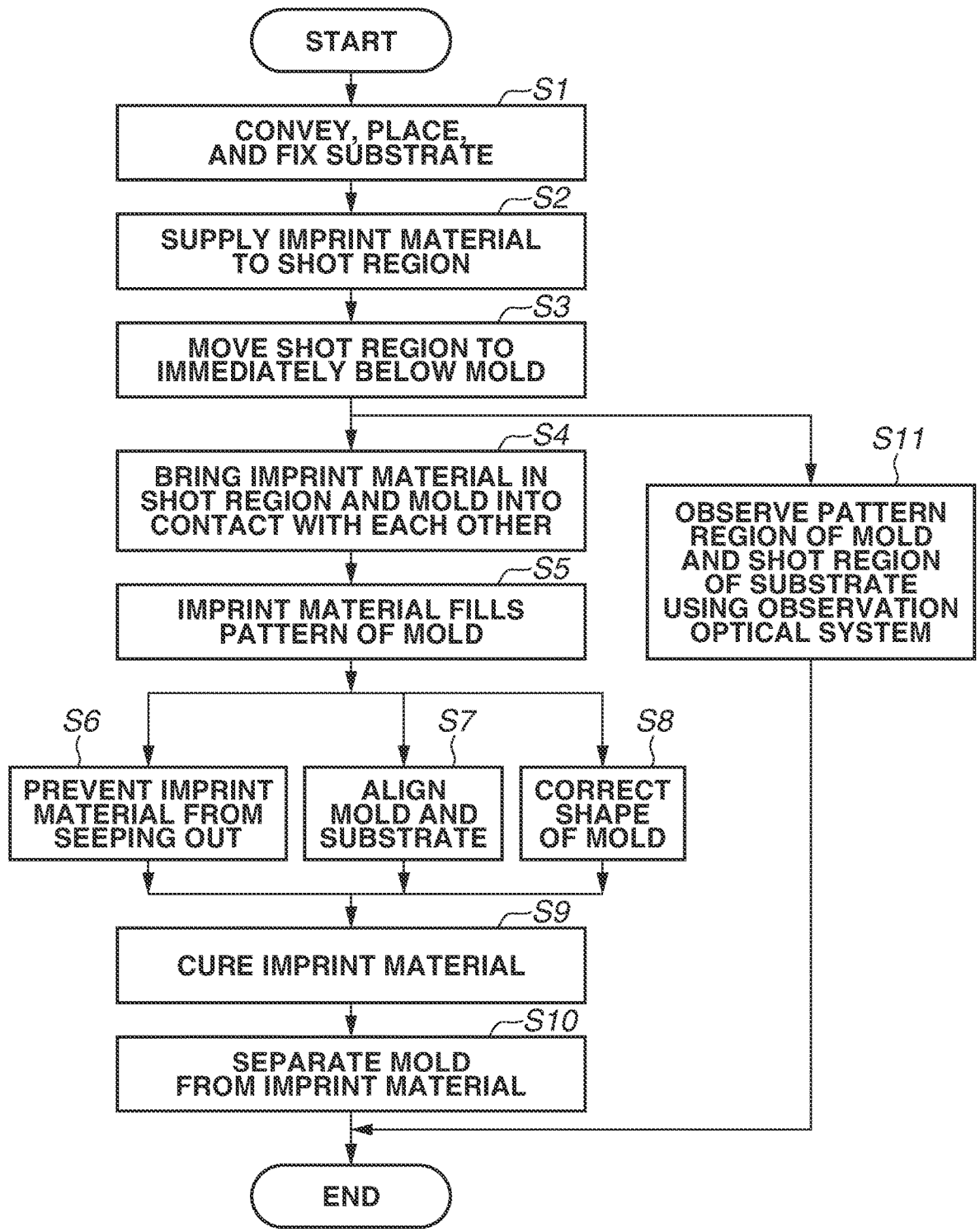
FIG. 3 is a flowchart illustrating an imprint process according to the first exemplary embodiment.

Next, with reference to FIG. 3, the steps of the imprint process performed by the imprint apparatus 100 are described. FIG. 3 is a flowchart illustrating the imprint process according to the present exemplary embodiment.

If the imprint process is started, then in step S1, the controller 140 controls a substrate conveyor (not illustrated) to convey the substrate W to the wafer stage 5, place the substrate W on the wafer stage 5, and then fix the substrate W to the wafer stage 5. In step S2, the controller 140 moves the wafer stage 5 so that the shot region S of the substrate W moves to the application position of the applier 7. Then, the controller 140 controls the applier 7 to supply the imprint material R to the predetermined shot region S (imprint region) of the substrate W (application step). Next, in step S3, the controller 140 moves the wafer stage 5 so that the predetermined shot region S of the substrate W onto which the imprint material R is supplied is located immediately below the mold M.

Next, in step S4, the controller 140 controls a driving mechanism of the mold holder 6 to operate so that the imprint material R in the shot region S of the substrate W and the pattern region of the mold M come into contact with each other (pressing step). After the mold M and the imprint material R come into contact with each other, then in step S5, the imprint material R fills the uneven pattern Mp formed on the mold M by pressing the mold M against the imprint material R (bringing the mold M into contact with the imprint material R) (filling step).

Figure 4A:
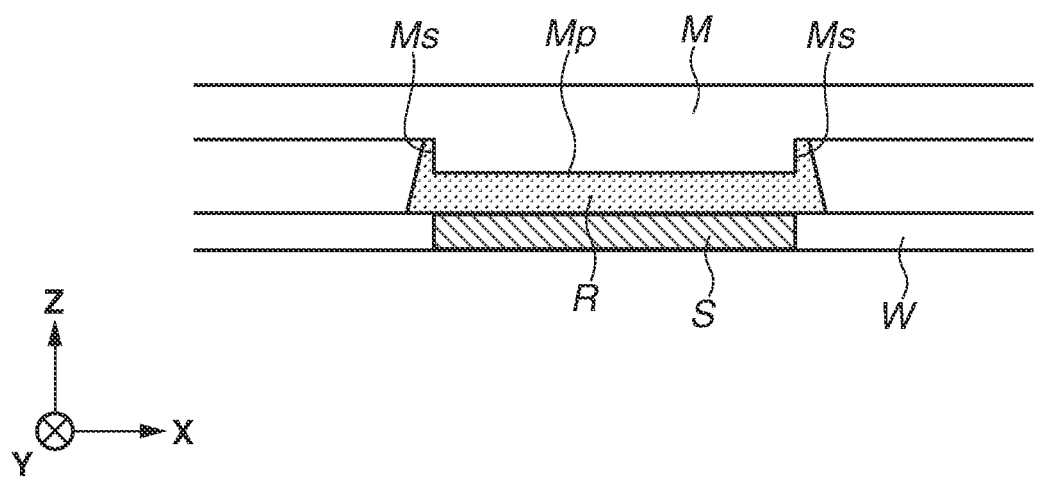
FIGS. 4A and 4B are diagrams illustrating a case where the imprint material seeps out to outside of a region where a pattern of a mold is formed.
Figure 4B:
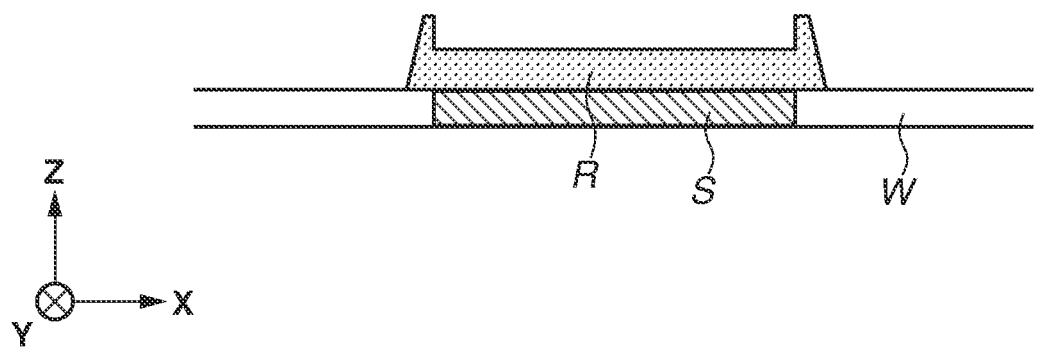

When the imprint material R fills the uneven pattern Mp of the mold M in step S5, since the imprint material R has excellent wettability with the mold M, the imprint material R may seep out to side surfaces Ms (outer edges) of the region where the uneven pattern Mp of the mold M is formed as illustrated in FIG. 4A. The region where the uneven pattern Mp of the mold M is formed has a protruding shape toward the substrate W and is also referred to as a mesa portion. If the imprint material R is cured in a state in which the imprint material R is attached to the side surfaces Ms of the mesa portion of the mold M and the mold M is separated from the cured imprint material R, then as illustrated in FIG. 4B, the imprint material R can be molded to include projection shape portions. If the imprint material R is molded to include the projection shape portions as illustrated in FIG. 4B, the film thickness of the imprint material R may not be uniform, which may influence an etching process in post-processing. If a part of the cured imprint material R is attached to the side surfaces Ms of the pattern region of the mold M after a release step, the cured product of the attached imprint material R may fall as a foreign substance onto the substrate W during the imprint process. In this case, if the mold M is pressed against the cured product of the imprint material R that has dropped onto the substrate W, the uneven pattern Mp formed on the mold M may be destroyed. Further, the cured product of the imprint material R dropped onto the substrate W can cause a device failure due to a pattern formation failure. In the present exemplary embodiment, an imprint apparatus is provided that reduces the attachment of the imprint material R to the side surfaces Ms of the mold M, prevents a device failure and the destruction of the mold M, and has high yield.

Figure 5A:
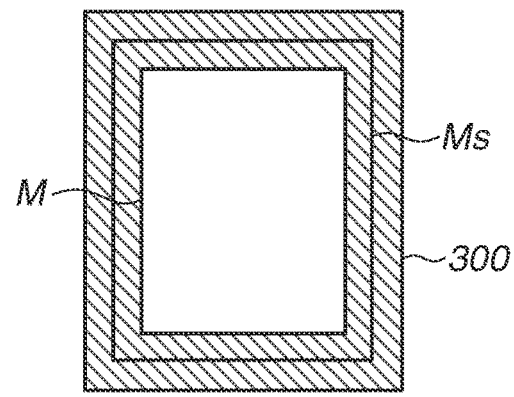
FIGS. 5A to 5C are diagrams illustrating an illumination region of the optical system that illuminates the partial region of the shot region.

In step S6, the controller 140 prevents the imprint material R from seeping out to the outside of the pattern region formed on the mold M. In the step of preventing the imprint material R from seeping out, when the pattern region of the mold M is brought into contact with the imprint material R, the controller 140 controls the preliminary exposure optical system 4 to emit light to a region 300 (shaded portion) including the side surfaces Ms of the mold M as illustrated in FIG. 5A. The light is not limited to ultraviolet light, and can be light for photo-curing the imprint material R or light for increasing the viscous property (viscosity) of the imprint material R.

Figure 5B:
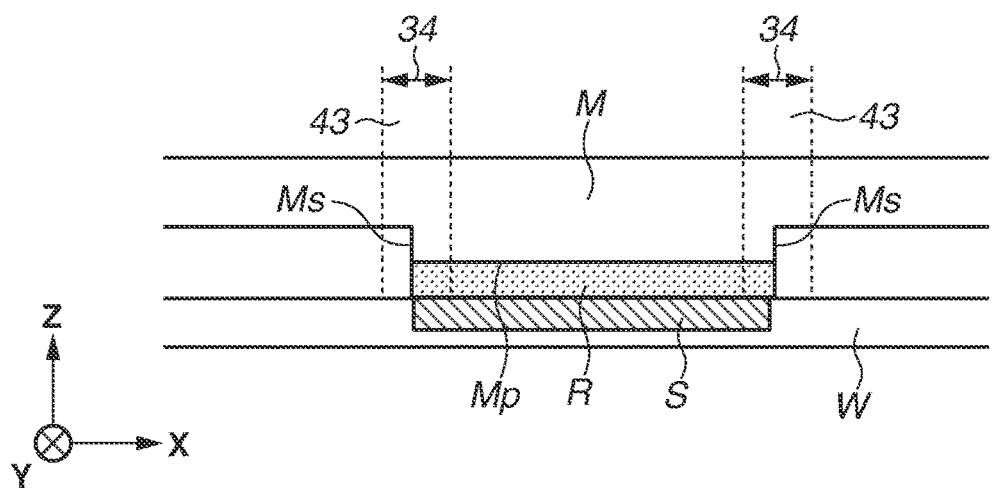

FIG. 5B illustrates a schematic diagram of the imprint material R sandwiched between the pattern region of the mold M and the substrate W when viewed from one of the side surfaces Ms. The pattern region of the mold M and the imprint material R supplied onto the substrate W come into contact with each other, whereby the imprint material R starts to spread toward the outside (side surfaces Ms) of the pattern region of the mold M. Before the imprint material R spreads in the pattern region, the preliminary exposure light 43 is emitted in advance to the region 300 including the side surfaces Ms of the mold M. By the imprint material R being irradiated with the preliminary exposure light 43, a polymerization reaction gradually initiates, and the viscous property (viscosity) of the imprint material R increases. The viscous property (viscosity) of the imprint material R located near the side surfaces Ms of the mesa portion of the mold M increases, whereby the moving speed of the imprint material R spreading toward the outside of the mesa portion of the mold M decreases. Thus, it is possible to prevent the imprint material R from being attached to the side surfaces Ms of the mold M. The timing when the preliminary exposure light 43 is emitted may be before the mold M and the imprint material R on the substrate W come into contact with each other, or the emission of the preliminary exposure light 43 may be started after the mold M and the imprint material R come into contact with each other. The light intensity, the timing of emission, and the irradiation region of the preliminary exposure optical system 4 that are required to increase the viscous property (viscosity) of the imprint material R differ depending on the type of the imprint material R. Thus, it is possible to search for conditions by experiment using a test substrate.

In the present exemplary embodiment, as illustrated in FIG. 5B, the preliminary exposure light 43 from the preliminary exposure optical system 4 is emitted to a region including the side surfaces Ms of the pattern region of the mold M, whereas the preliminary exposure light 43 is not emitted to a center portion of the mold M in which the uneven pattern Mp is formed. As described above, the preliminary exposure light 43 is emitted to the side surfaces Ms of the pattern region of the mold M, whereby it is possible to prevent the imprint material R from being attached to the side surfaces Ms and maintain the property of filling the uneven pattern Mp without changing the viscous property (viscosity) of the imprint material R in the center portion of the mold M.

In parallel with the step of preventing the imprint material R from seeping out in step S6, in step S7, the controller 140 may control the alignment optical system 2 to detect the alignment marks 10 formed on the mold M and the alignment marks 11 formed on the substrate W and make the position adjustment of the mold M and the substrate W. In step S7, based on the result of detection of the alignment marks 10 and 11 by the alignment optical system 2, the controller 140 moves the wafer stage 5 to make the position adjustment of the pattern region of the mold M and the shot region S of the substrate W.

Further, in parallel with the step of preventing the imprint material R from seeping out in step S6, in step S8, the controller 140 may control the shape correction mechanism (not illustrated) to correct the shape of the pattern region of the mold M. In step S8, not only the shape of the mold M but also the shape of the shot region S formed on the substrate W may be corrected. As a method for correcting the shape of the shot region S of the substrate W, a method for deforming the substrate W by applying heat to the substrate W is known.

After the imprint material R fills the uneven pattern Mp of the mold M in step S5 and the position adjustment of the mold M and the substrate W is made in step S7, then in step S9, the controller 140 controls the exposure illumination system 1 to emit light to the imprint material R to cure the imprint material R (curing step). In step S9, the exposure illumination system 1 emits ultraviolet light to the shot region S of the substrate W through the pattern region of the mold M from a back surface (upper surface) of the mold M, whereby the imprint material R in the shot region S cures with the ultraviolet light having passed through the mold M. Next, in step S10, the controller 140 controls the mold driving mechanism to drive the mold M in the Z-direction to separate the mold M from the cured imprint material R on the substrate W (release step). By the release step in step S10, the pattern of the cured imprint material R is formed in the shot region S of the substrate W.

Step S11 may be executed between the pressing step in step S4 and the release step in step S10 in the imprint process. In step S11, the controller 140 observes the pattern region of the mold M and the shot region S of the substrate W using the observation optical system 3. In step S11, the pattern region and the shot region S are observed using the observation optical system 3, whereby it is possible to monitor whether an abnormality occurs in the imprint process.

The above steps are performed, whereby it is possible to transfer the uneven pattern Mp formed on the mold M to the shot region S of the substrate W with excellent overlay accuracy. Then, the imprint apparatus 100 according to the present exemplary embodiment has the above-described configuration, whereby the exposure illumination light from the exposure illumination system 1 that requires high illuminance at a wavelength for curing the imprint material R and the alignment light from the alignment optical system 2 that requires a wide wavelength range can coexist. Further, it is possible to provide the imprint apparatus 100 capable of using both the preliminary exposure light 43 of which an illumination region can be selected to be in any shape, and the observation light for observing the shot region S.

Figure 6:
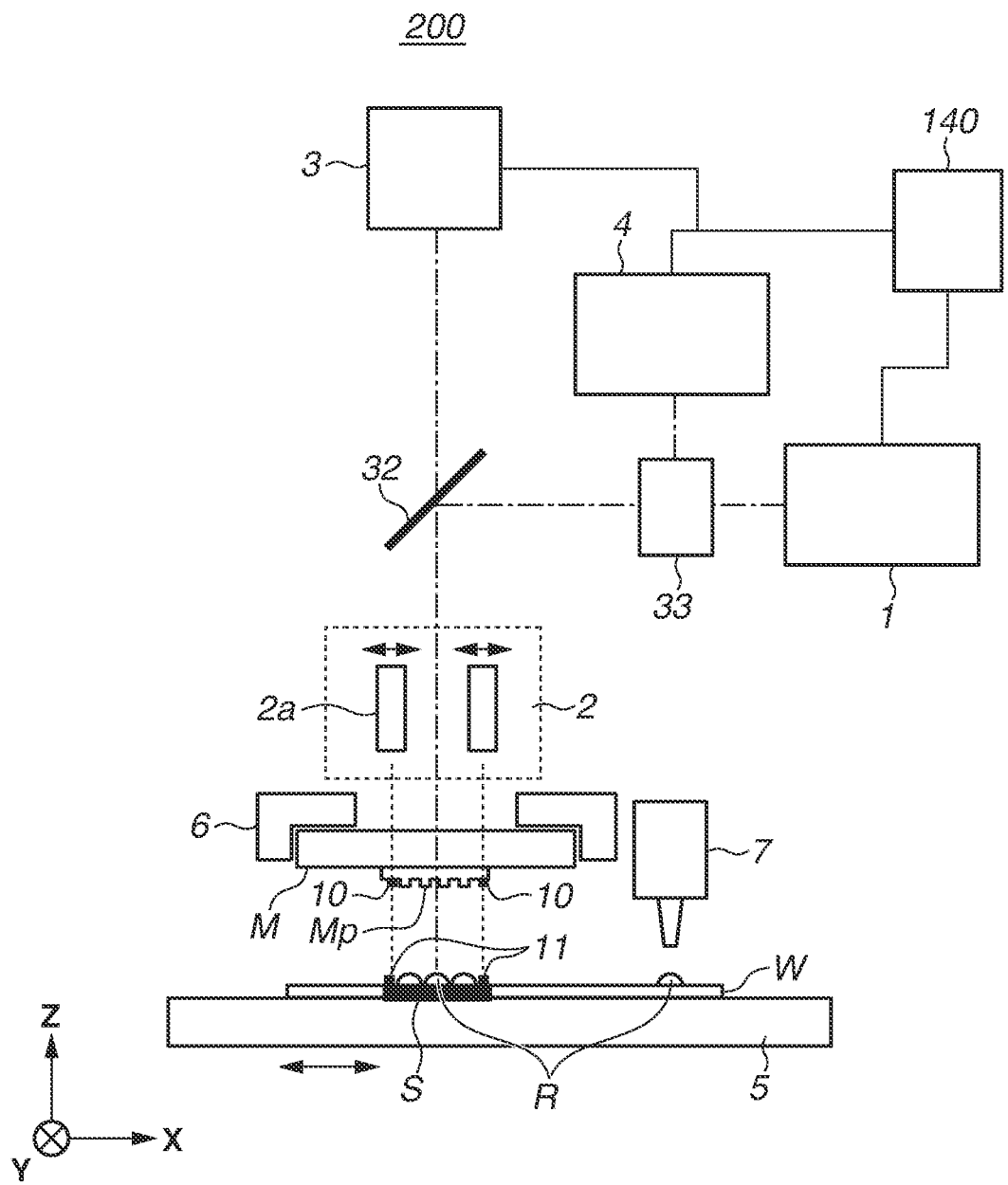
FIG. 6 is a diagram illustrating a configuration of an imprint apparatus according to a second exemplary embodiment.

FIG. 6 is a schematic diagram of an imprint apparatus 200 according to a second exemplary embodiment. In FIG. 6, components similar to those in FIG. 1 are designated by the same signs and are not described. FIG. 6 is different from FIG. 1 in that the alignment optical system 2 does not include the relay optical system that forms the conjugate plane, and the light-receiving units 2a forming scopes that can be driven directly measure the substrate W. The light-receiving units 2a are arranged perpendicular to the shot region S of the substrate W.

The light-receiving units 2a detect the alignment marks 10 on the mold M and the alignment marks 11 in the shot region S of the substrate W. In this configuration, in a case where the mold M and the substrate W are aligned based on the detection results of the light-receiving units 2a while the preliminary exposure optical system 4 emits light to the shot region S, it is necessary to prevent the light from the preliminary exposure optical system 4 from illuminating the light-receiving units 2a. Further, when the shot region S is observed using the observation optical system 3, it is necessary to recognize that the light-receiving units 2a hinder observation of a partial region of the shot region S. In the step of curing the imprint material R with the light from the exposure illumination system 1, it is necessary to drive the light-receiving units 2a to retract so that the light-receiving units 2a do not block the exposure illumination light.

The configuration in FIG. 6 eliminates (or reduces) optical members that the alignment optical system 2 shares with the exposure illumination system 1, the observation optical system 3, and the preliminary exposure optical system 4. Thus, the wavelength range used by the alignment optical system 2 may overlap the wavelength range used by the observation optical system 3 as long as the wavelength range used by the alignment optical system 2 does not overlap the wavelengths of the exposure illumination light and the preliminary exposure light. Thus, it is possible to select a wavelength with a higher degree of freedom.

Figure 7:
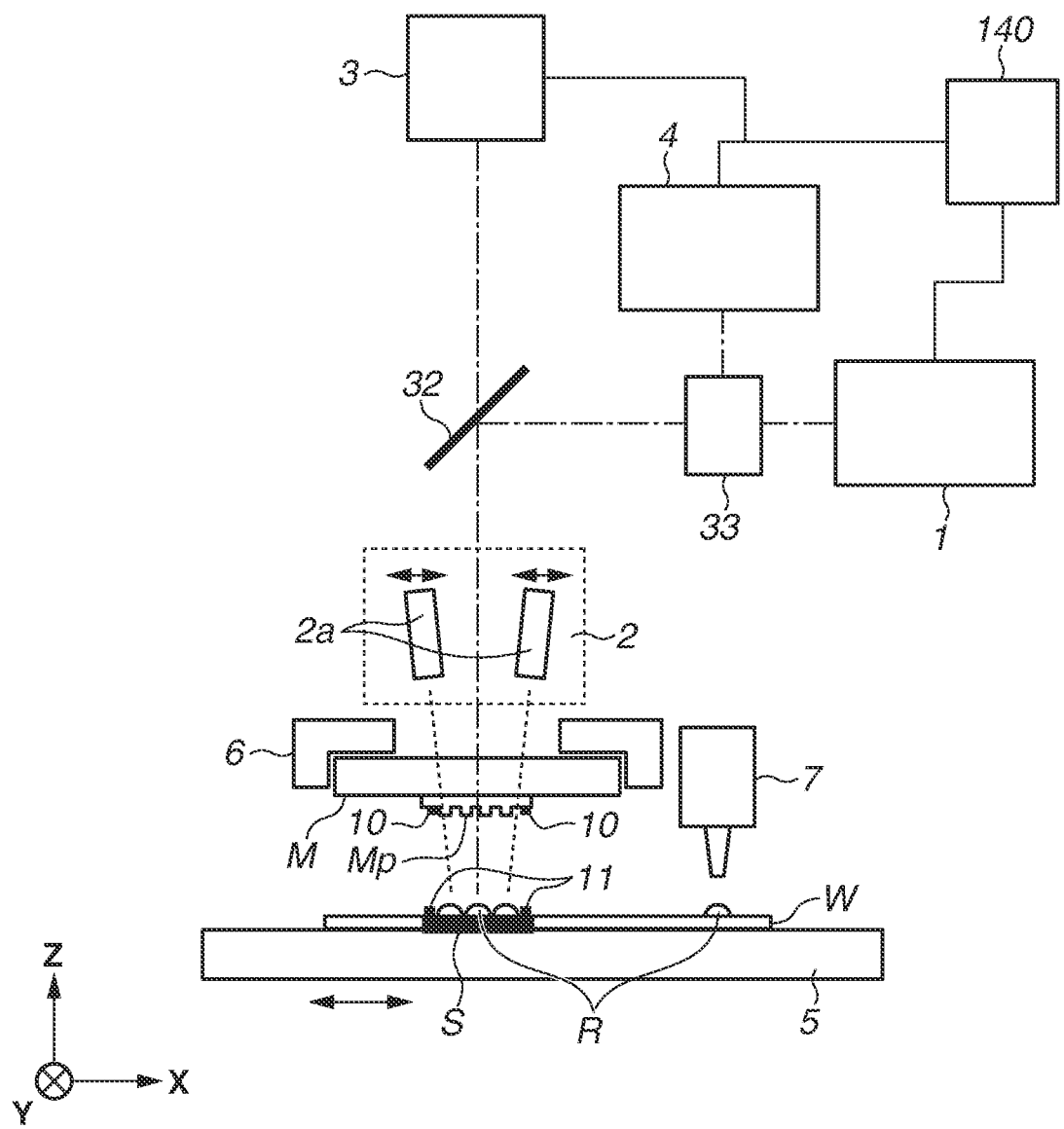
FIG. 7 is a diagram illustrating a configuration of an imprint apparatus according to a third exemplary embodiment.

FIG. 7 is a schematic diagram of an imprint apparatus 210 according to a third exemplary embodiment. In FIG. 7, components similar to those in FIG. 6 are designated by the same signs and are not described. FIG. 7 is different from FIG. 6 in that the optical axes of light-receiving units 2a forming scopes that can be driven in the alignment optical system 2 are arranged obliquely with respect to the surface (or a normal to the surface) of the substrate W. The light-receiving units 2a are arranged obliquely so as to move away from the normal to the surface of the shot region S of the substrate W, whereby the light-receiving units 2a can observe the alignment marks 10 and 11 without blocking the light from the exposure illumination system 1, the observation optical system 3, and the preliminary exposure optical system 4. Since the light-receiving units 2a do not block other light, it is not necessary to drive the light-receiving units 2a to retract. Thus, it is possible to shorten the time required for the series of steps in the imprint process.

With reference to FIG. 7, the imprint apparatus 210 according to the third exemplary embodiment is described. In the present exemplary embodiment, the timing when the preliminary exposure optical system 4 emits light to the shot region S of the substrate W is not collectively set for the shot region S, and is varied in the shot region S. A form is described in which the timing of emission of light is varied depending on a position of the partial region in the shot region S, such as the centers of sides of the shot region S or four corners of the shot region S.

The imprint material R sandwiched between the pattern region of the mold M and the shot region S of the substrate W first come into contact with a center portion of the pattern region. Thus, the timing when an outer boundary (or a front) of a contact region (i.e., a region where the imprint material R and the pattern region are in contact with each other) reaches the centers of the sides of the shot region S is different from the timing when the outer boundary reaches the four corners of the shot region S. If the timing of the emission of light from the preliminary exposure optical system 4 is collectively set for the shot region S, a difference occurs in the amount of light received by the imprint material R depending on the position in an outer peripheral portion of the shot region S. In this case, unevenness occurs in the viscous property (viscosity) of the imprint material R. This may influence the subsequent alignment accuracy.

The timing when the outer boundary of the contact region reaches the side surfaces Ms of the pattern region of the mold M (sides of the shot region S) can be obtained in advance by simulation or experiment. Then, the controller 140 can control the light adjuster 41 so that the preliminary exposure light 43 is emitted based on the obtained timing. As a result, it is possible to reduce the variation of changes in the viscous property (changes in the viscosity) of the imprint material R depending on the position in the outer peripheral portion of the shot region S. On each of the four sides of the shot region S, the timing of emission is varied at least between a portion near the center of the side and end portions (the four corners of the shot region S), whereby it is possible to prevent the imprint material R from seeping out without reducing alignment performance.

Figure 5C:
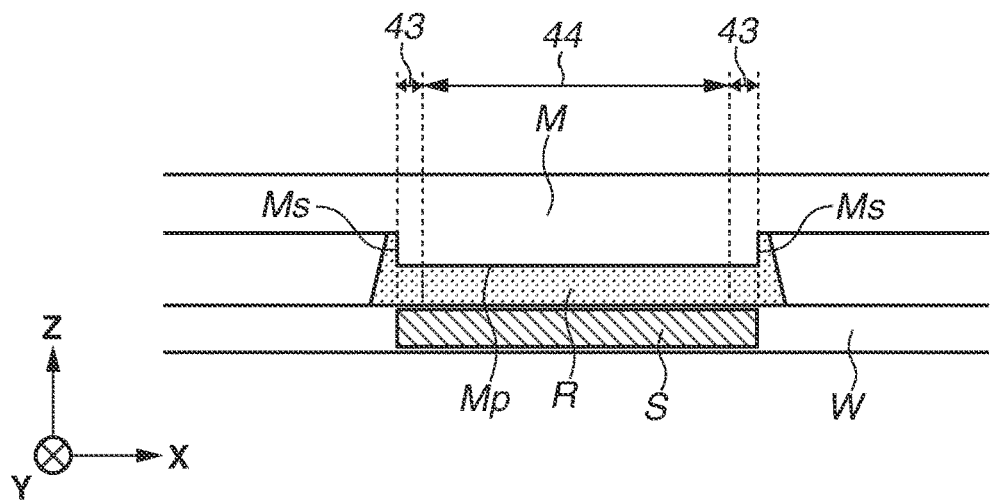

With reference to FIG. 5C, an imprint apparatus according to a fourth exemplary embodiment is described. In the present exemplary embodiment, an irradiation region is controlled so that the light from the preliminary exposure optical system 4 and the light from the exposure illumination system 1 are not emitted to the imprint material R having seeped out of the side surfaces Ms of the uneven pattern Mp formed on the mold M. Consequently, the imprint material R having seeped out of the side surfaces Ms of the pattern region of the mold M volatilizes with the lapse of time in the imprint process. Thus, the imprint material R having seeped out ceases to exist. As described above, the present exemplary embodiment uses volatilization of the imprint material R. The imprint material R may volatilize with the lapse of time, or may be volatilized by purposely supplying gas.

As illustrated in FIG. 5C, in the present exemplary embodiment, light 44 from the exposure illumination system 1 is adjusted using the field stop 111 so that the inside of the region where the uneven pattern Mp of the mold M is formed is irradiated. At this time, if the shape of the shot region S is a rectangular shape, an irradiation region can be adjusted using the field stop 111. However, in a case where the shape of the shot region S is not a simple rectangular shape and unevenness is formed on the sides of the shot region S (the sides of the shot region S are not linear), the field stop 111 alone may not be able to adjust the irradiation region. In this case, with respect to the complex shapes of the sides of the shot region S, the preliminary exposure light 43 is formed into any shape using the light adjuster 41 of the preliminary exposure optical system 4, whereby it is possible to adjust the irradiation region. The imprint material R inside the shot region S is cured by being irradiated with the light 44 from the exposure illumination system 1. The irradiation region is thus adjusted, whereby it is possible to avoid emitting light for curing the imprint material R to the imprint material R having seeped out to the outside of the pattern region.

As described above, the imprint material R having seeped out to the outside of the pattern region of the mold M (or the shot region S) does not cure, and thus does not remain on the substrate W. Further, the imprint material R attached to the side surfaces Ms of the pattern region does not cure, either, and thus, the cured product of the imprint material R does not drop as a foreign substance onto the substrate W. Thus, it is possible to reduce the breakage of the mold M due to a foreign substance on the substrate W.

The pattern of a cured product formed using an imprint apparatus is permanently used in at least a part of each of various articles, or temporarily used to manufacture each of various articles. Examples of the article include an electric circuit element, an optical element, microelectromechanical systems (MEMS), a recording element, a sensor, and a mold. Examples of the electric circuit element include a volatile or non-volatile semiconductor memory such as a dynamic random-access memory (DRAM), a static random-access memory (SRAM), a flash memory, or a magnetoresistive random-access memory (MRAM), and a semiconductor device such as a large-scale integration (LSI) device, a charge-coupled device (CCD), an image sensor, and a field-programmable gate array (FPGA). Examples of the mold include a mold for imprint.

The pattern of the cured product is used as it is as a component member of at least a part of the article, or temporarily used as a resist mask. After etching or ion implantation is performed in the step of processing a substrate, the resist mask is removed. Further, examples of known step of processing the substrate include etching, resist removal, dicing, bonding, and packaging.

Figure 8A:
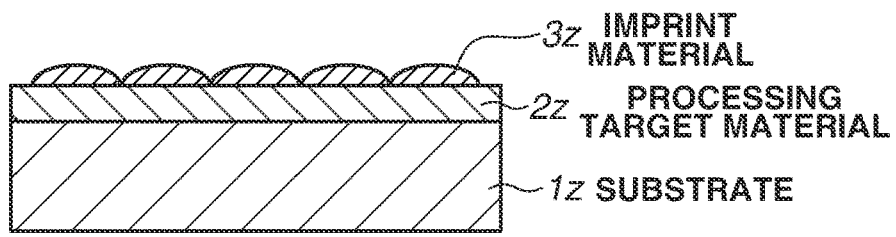
FIGS. 8A to 8F are diagrams illustrating a method for manufacturing an article.

Next, a specific method for manufacturing an article is described. As illustrated in FIG. 8A, a substrate 1z such as a silicon wafer, on a surface of which a processing target material 2z such as an insulator is formed, is prepared. Next, an imprint material 3z is applied to a surface of the processing target material 2z by an inkjet method. FIG. 8A illustrates the state in which the imprint material 3z in the form of a plurality of droplets is applied onto the processing target material 2z on the substrate 1z.

Figure 8B:
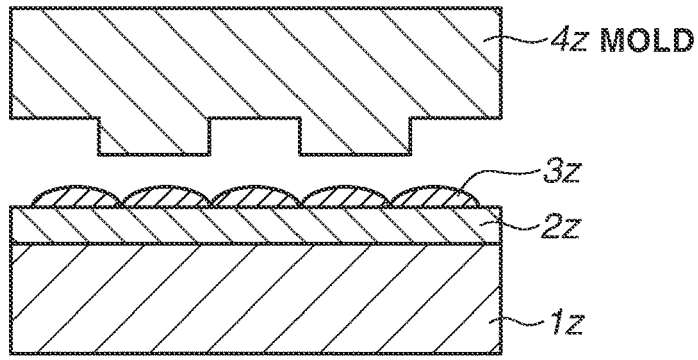
Figure 8C:
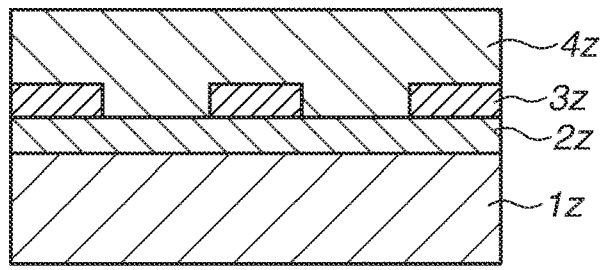

As illustrated in FIG. 8B, a mold 4z for imprint is opposed to the imprint material 3z on the substrate 1z with a surface of the mold 4z where an uneven pattern is formed facing the imprint material 3z. As illustrated in FIG. 8C, the substrate 1z onto which the imprint material 3z is applied and the mold 4z are brought into contact with each other, and pressure is applied thereto. The imprint material 3z fills a gap between the mold 4z and the processing target material 2z. If light as curing energy is emitted through the mold 4z to the imprint material 3z in this state, the imprint material 3z cures.

Figure 8D:
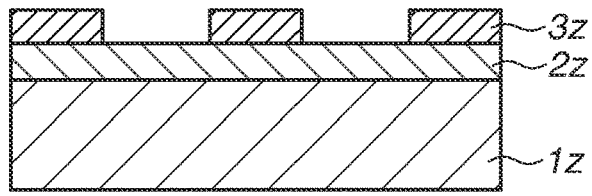

As illustrated in FIG. 8D, after the imprint material 3z is cured, the mold 4z and the substrate 1z are separated from each other, and the pattern of the cured product of the imprint material 3z is formed on the substrate 1z. The pattern of the cured product has such a shape that a recessed portion of the mold 4z corresponds to a protruding portion of the cured product and a protruding portion of the mold 4z corresponds to a recessed portion of the cured product. In other words, the uneven pattern of the mold 4z is transferred to the imprint material 3z.

Figure 8E:
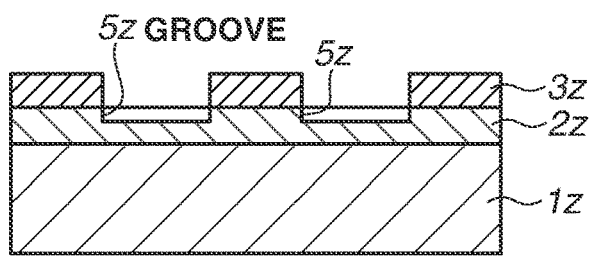
Figure 8F:
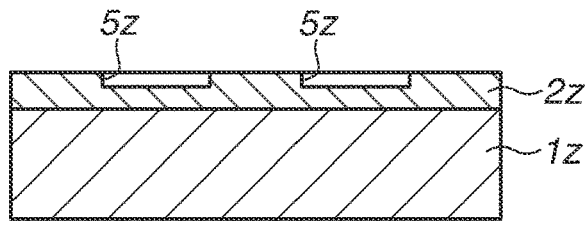

As illustrated in FIG. 8E, etching is performed using the pattern of the cured product as an anti-etching mask, and a portion of the surface of the processing target material 2z where the cured product is not present or thinly remains is removed, thereby forming grooves 5z. As illustrated in FIG. 8F, if the pattern of the cured product is removed, an article in which the grooves 5z are formed on the surface of the processing target material 2z can be obtained. In this case, the pattern of the cured product is removed. Alternatively, even after the processing, the pattern of the cured product may not be removed and may be used as, for example, an interlayer insulating film included in a semiconductor device, i.e., a component member of the article. The method for manufacturing an article according to the present exemplary embodiment has an advantage over a conventional method in at least one of the performance, the quality, the productivity, and the production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-197773, filed Oct. 30, 2019, which is hereby incorporated by reference herein in its entirety.

What is claimed is:

1. An imprint apparatus configured to cure an uncured imprint material supplied onto a substrate and in contact with a mold are in contact with each other, and separate the mold from the imprint material to form a pattern of the imprint material, the imprint apparatus comprising:
   a first illumination optical system configured to emit first light for curing the imprint material sandwiched between the mold and the substrate;
   a second illumination optical system including a light adjuster configured to illuminate the imprint material in a part of a region between the mold and the substrate, the second illumination optical system configured to emit second light for increasing a viscosity of the imprint material in the part of the region or for curing the imprint material in the part of the region; and
   a combiner located on a common pupil plane of the first illumination optical system and the second illumination optical system and configured to combine the first light and the second light,
   wherein the first illumination optical system is configured to form an annular light intensity distribution on the pupil plane by the first light, and
   wherein the combiner includes a mirror located in a region surrounded by the annular light intensity distribution on the pupil plane to reflect the second light and to allow the first light to pass through.

2. The imprint apparatus according to claim 1, wherein a wavelength of the first light and a wavelength of the second light are different from each other.

3. The imprint apparatus according to claim 1, wherein a wavelength of the second light is included in a wavelength range of the first light.

4. The imprint apparatus according to claim 1, wherein an intensity of the first light is greater than an intensity of the second light.

5. The imprint apparatus according to claim 1, wherein the light adjuster includes any one of a digital mirror device, a liquid crystal element, a hologram, and a galvanometer mirror element.

6. The imprint apparatus according to claim 1, wherein the second illumination optical system illuminates a region including an outer edge of a region of a pattern formed on the mold with second light.

7. The imprint apparatus according to claim 1,
   wherein the second illumination optical system illuminates a partial region inside an outer edge of a region of a pattern formed on the mold, and
   wherein the first illumination optical system illuminates a region different from the region irradiated by the second illumination optical system in the region of the pattern formed on the mold.

8. The imprint apparatus according to claim 1, wherein the first light does not enter the mirror.

9. The imprint apparatus according to claim 1, wherein an angle distribution of the first light emitted from the combiner is converted into a light intensity distribution on each point of the imprint material where the first light is incident on, and an angle distribution of the second light emitted from the combiner is converted into a light intensity distribution on each point of the imprint material where the second light is incident on.

* * * * *